United States Patent
Fontana et al.

[11] Patent Number: 5,935,453
[45] Date of Patent: *Aug. 10, 1999

[54] MR SENSOR HAVING END REGIONS WITH PLANAR SIDES

[75] Inventors: Robert E. Fontana, San Jose; Tsann Lin, Saratoga; Neil Leslie Robertson, Palo Alto; Ching Hwa Tsang, Sunnyvale, all of Calif.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/893,027

[22] Filed: Jul. 15, 1997

Related U.S. Application Data

[63] Continuation of application No. 08/559,951, Nov. 16, 1995, abandoned.

[51] Int. Cl.$^6$ ...................................................... B44C 1/22
[52] U.S. Cl. ................................................. 216/22; 216/45
[58] Field of Search .......................... 360/113; 338/32 R; 324/252; 216/22, 45

[56] References Cited

U.S. PATENT DOCUMENTS

| | | | |
|---|---|---|---|
| 4,272,348 | 6/1981 | Cox et al. | 204/192 |
| 4,411,757 | 10/1983 | Kitada et al. | 204/192 E |
| 4,639,806 | 1/1987 | Kira et al. | 360/113 |
| 4,683,508 | 7/1987 | Jeffers et al. | 360/113 |
| 5,018,037 | 5/1991 | Krounbi et al. | 360/113 |
| 5,079,035 | 1/1992 | Krounbi et al. | 427/130 |
| 5,309,304 | 5/1994 | Naberhuis et al. | 360/113 |
| 5,412,524 | 5/1995 | Nagata et al. | 360/113 |
| 5,492,720 | 2/1996 | Gill et al. | 427/131 |
| 5,510,941 | 4/1996 | Ohyama et al. | 360/113 |
| 5,557,492 | 9/1996 | Gill et al. | 360/113 |
| 5,563,753 | 10/1996 | Mowry et al. | 360/113 |
| 5,664,316 | 9/1997 | Chen et al. | 29/603.08 |

FOREIGN PATENT DOCUMENTS 6-333216  12/1994  Japan.

*Primary Examiner*—Bruce Breneman
*Assistant Examiner*—Alva Powell
*Attorney, Agent, or Firm*—Paik Saber; Thomas R. Berthold

[57] ABSTRACT

A magnetoresistive (MR) sensor having passive end regions separated by a central active region in which an MR sensing element is formed over substantially only the central active region. The MR sensor is defined by forming a resist pattern over both the end regions and the MR sensing element followed by an etching step where the duration of the etching is controlled by the time it takes to remove the exposed end regions' material and not by the time it takes to remove the excess MR material in the center active region. This creates an MR sensor having planar sides along the circumference of the end regions where the planar sides have no thinned edges or shoulders. The MR sensor further has no remnant MR material along the inner planar side of the end regions behind the MR sensor's trackwidth edge and adjacent to the MR sensor's back side.

16 Claims, 9 Drawing Sheets

MR SENSOR HAVING END REGIONS WITH PLANAR SIDES

This is a continuation of application Ser. No. 08/559,951 filed on Nov. 16, 1995 now abandoned.

BACKGROUND OF THE INVENTION

1. Technical Field

This invention relates to a thin film magnetic head having a magnetoresistive (MR) read sensor for detecting signals recorded on a magnetic recording medium. More particularly, this invention relates to an improvement in construction of a low noise longitudinally biased MR read sensor.

2. Description of the Background Art

The use of a magnetoresistive (MR) sensor (also referred to as "transducer" or "head") to read signals recorded on a magnetic recording medium has been well established in the field of information storage and is believed to be the replacement for inductive read sensors. This is due to the fact that the MR read sensor has the following major advantages over the inductive read sensor:

1) the MR sensor's intrinsic noise is much lower than the inductive read sensor intrinsic noise thus providing improved signal-to-noise (S/N) performance,
2) the MR sensor senses magnetic flux, not the rate of magnetic flux change, which means the magnetic signal recorded on the storage medium can be reproduced independently of the speed at which the medium is moving with respect to the sensor, and
3) the MR sensor has bandwidth in gigahertz (gHz) range which allows areal storage density well in excess of 1 Gb/inch$^2$ (1 gigabit per square inch).

MR sensors currently fall into two broad classes: 1) anisotropic magnetoresistive (AMR) sensors and 2) giant magnetoresistive (GMR) sensors. In the AMR sensors, the resistance of the MR sensing element varies as a function of $\cos^2\alpha$ where $\alpha$ is the angle between the magnetization and the direction of the sense current flowing in the sensing element. The sensing element is generally made of ferromagnetic material. In the GMR sensor, the resistance of the MR sensing element varies as a function of spin-dependent transmission of electrons between pinned and free magnetic layers separated by non-magnetic layers and the accompanying spin-dependent scattering which takes place at the interface of the magnetic and non-magnetic layers. The magnetic layers are generally made of ferromagnetic material. GMR sensors using only two layers of ferromagnetic material separated by a layer of non-magnetic metallic material are generally referred to as spin valve (SV) MR sensors. The two layers of ferromagnetic material separated by a layer of non-magnetic metallic material are also referred to as "spin valve material".

FIG. 1 is a cross-section of a conventional thin film MR sensor 10, comprising magnetic shields 12 and 14, interlayer insulating material 13 and 15, MR sensor 18, soft magnetic material 16 for transverse biasing of the MR sensor, and leads 20 and 22. Leads 20 and 22 further comprise conductor materials and magnetic materials where the magnetic materials are used to longitudinally bias the MR sensor to eliminate Barkhausen noise.

As the demand for higher capacity storage devices continues to grow, it has become increasingly more important to produce MR read sensors small enough to read the data recorded in ever decreasing track widths at ever increasing recording density. One of the most prevailing solutions for meeting these requirements is described in commonly assigned U.S. Pat. No. 5,079,035 in which the disclosed MR sensor comprises an MR layer extending over substantially only a central active region and a hard magnetic bias layer provided in each of two passive end regions. Each end region further forms an abutting junction with the MR layer to produce longitudinal bias in the MR read sensor as shown in FIG. 2A.

Referring to FIG. 2A, there is shown a cross section of an MR read sensor 50 comprising an MR layer 62 deposited over substrate 66 and extending over substantially only the central active region 64 and a hard magnetic bias layer (also referred to as "longitudinal bias layer") 58 in each end region 52. Each end region 52 further includes a conductor layer 54 deposited over each magnetic bias layer 58. Each longitudinal bias layer 58 forms a contiguous (abutting) junction 60 with MR layer 62 to produce a longitudinal bias field in the MR read sensor 50.

In order to fabricate MR sensor 50 shown in FIG. 2A, a photoresist pattern is generally formed over both end regions 52 and MR layer 62. The pattern is then developed and the excess MR material is then removed, preferably by ion beam milling. Since end regions 52, which consist of both conductor material 54 and longitudinal bias material 58, are generally thicker than MR layer 62 in the central active region, and since the duration of ion beam milling is determined by the time it takes to remove the excess MR material, this means that not all of the exposed end regions' material are removed during the etching step. This in turn leads to the creation of thinned edges (shoulder) around the circumference of the end regions as well as leaving remnant MR material behind along a portion of the thinned edges and near the back edge of the MR sensor as shown in FIG. 2B.

FIG. 2B shows a top view of the MR sensor of FIG. 2A after ion beam milling and lapping steps comprising lead (magnetic bias and conductor materials) 70 in each end region 52 and thinned edge 74 along the circumference of each lead 70. Each thinned edge 74 further comprises inner thinned region 76 having a thinned corner region 78. MR sensor 50 further comprises trackwidth edge 80 (the trackwidth edge of the MR sensor is the surface, also referred to as the air bearing surface (ABS), which is in close proximity to the surface of the storage medium and is used for reading previously recorded information), back edge 82, and magnetic remnant material 84 along the length of inner thinned region 76 and near back edge 82.

The presence of the thinned edges around the circumference of the end regions as well as the remnant MR material are due to the method by which the prior art MR sensor is manufactured which is shown in FIGS. 3A–3F. FIG. 3A shows a top view of a step 100 of a process for fabricating an MR sensor prior to ion beam milling comprising MR material 120, end regions 110, and photoresist material 130. FIG. 3B is a cross-section of FIG. 3A along the line B-B' which is the region directly behind the active region of the MR sensor. FIG. 3C is a cross-section of FIG. 3A along the line A-A' which is a part of the active region of the MR sensor.

FIG. 3D shows a top view of step 112 of the process for fabricating the MR sensor after ion milling and photoresist removal steps where the duration of the ion beam milling has been determined by the time it would take to remove excess MR material. Step 112 comprises MR material 120, end regions 110, trackwidth edge 170, back edge 172, and thinned edges 140 of end regions 110. Each thinned edge 140 further comprises an inner thinned edge 160 having a thinned corner region 165. FIG. 3E is a cross-section of FIG.

3D along the line D-D' which is the region directly behind the MR sensor active region and FIG. 3F is a cross-section of FIG. 3D along the line C-C' which is a part of the active region of the MR sensor.

Referring back to FIGS. 3A–3F, it can be readily appreciated that the removal of the MR material by ion beam milling where the duration of ion beam milling is determined by the time it takes to remove excess MR material has the following major drawbacks:

(1) it leaves undesirable thinned edges 140 around the circumference of end regions 110, of which inner thinned edges 160 behind trackwidth edge 170 of the MR sensor and near back edge 172 of the MR sensor are the most undesirable one. Indeed, during the ion milling, the end regions can be thinned to such an extent that the longitudinal material below the conductor layer is reduced in thickness to the point that the magnetic properties of the thinned end regions are changed, thus substantially impacting the longitudinal bias of the MR sensor;

(2) the presence of thinned corner regions 165 result in a phenomenon known as current crowding which effect the amplitude of the signal read from magnetic storage medium; and, (3) ion beam milling does not completely remove the excess MR material; i.e., the material not covered by the photoresist (stencil) pattern, thus allowing a small remnant of MR material 150 to be left behind along the length of each inner thinned edge 160.

A small remnant of MR material 180 is also left behind along the length of each outer thinned edge 185. Remnant MR material 150 can substantially alter and degrade the magnetic domain activities and increase the MR sensor noise, especially if the longitudinal bias material thickness has been reduced, thus reducing the signal-to-noise ratio.

Therefore, there is a great need for an invention that can substantially eliminate the longitudinal instability (unstable bias point) caused by the thinned edges of the end regions of the MR sensor and by the magnetic domain altering behavior and noise producing remnant MR material left behind.

SUMMARY OF THE INVENTION

It is therefore an object of the present invention to disclose a method for producing an MR sensor having an improved longitudinal bias.

It is another object of the present invention to disclose a method for producing an MR sensor having low noise.

It is yet another object of the present invention to disclose a method for producing an MR sensor having passive end regions where the end regions have virtually no thinned edges.

It is still another object of the present invention to disclose a method for producing an MR sensor where the small remnant MR material is eliminated.

It is yet another object of the present invention to disclose a method for producing an MR sensor where the current crowding phenomenon is eliminated.

Toward this end and in accordance with the present invention, an MR sensor is disclosed which comprises passive end regions separated by a central active region. A thin MR layer is formed substantially over the central active region followed by forming a longitudinal bias and conducting materials in each passive end region. (The longitudinal bias and conducting materials in each end region are also referred together as lead material). The longitudinal bias material forms a contiguous (abutting) junction having electrical and magnetic continuity with the MR layer to produce a longitudinal bias in the MR sensor. The end regions have planar sides and no thinned edges or shoulders which causes the end regions to have a substantially uniform thickness t (FIG. 7B). Furthermore, there is virtually no remnant MR material along the inner planar sides of the end regions and near the back side of the MR sensor.

The preferred method for making the MR sensor of the present invention comprises an ion beam milling step for removing the excess MR material where the duration of the ion beam milling step is determined by the time it takes to remove the exposed end regions' materials and not by the time it takes to remove the excess MR material. This critical change, where the duration of the milling step is made dependent upon removal of the excess materials in the end regions as opposed to removal of the excess MR material in the central region, ensures that the exposed lead materials in the end regions, as well as the remnant MR material, are completely removed, thus allowing the production of an MR sensor with highly enhanced magnetic domain control, low noise, and longitudinal stability.

BRIEF DESCRIPTION OF THE DRAWINGS

For a fuller understanding of the nature and advantages of the present invention, as well as the preferred mode of making, reference should be made to the following detailed description read in conjunction with the accompanying drawings. In the following figures, like numerals indicate like parts and structural features.

BEST MODE FOR CARRYING OUT THE INVENTION

The following description is the best mode presently contemplated for carrying out the invention. This description is made for the purpose of illustrating the general principles of the present invention and is not meant to limit the inventive concepts claimed herein.

Figure 4A:
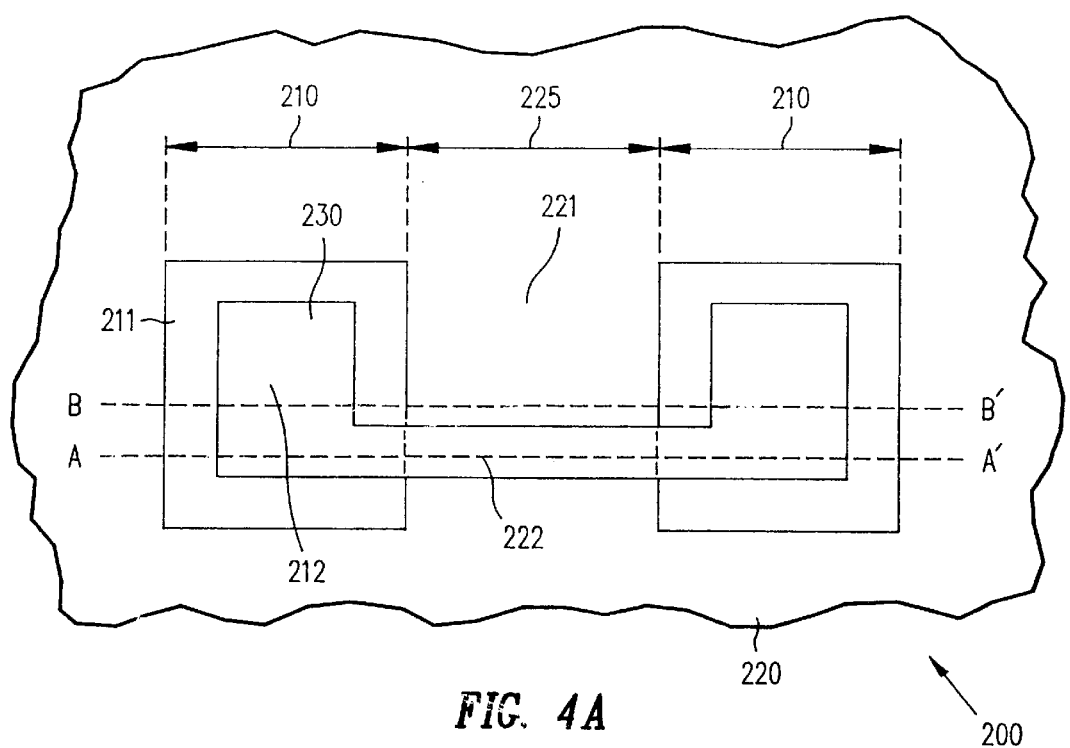
FIGS. 4A–4F show specific process steps for producing the MR sensor of the present invention.
Figure 4B:
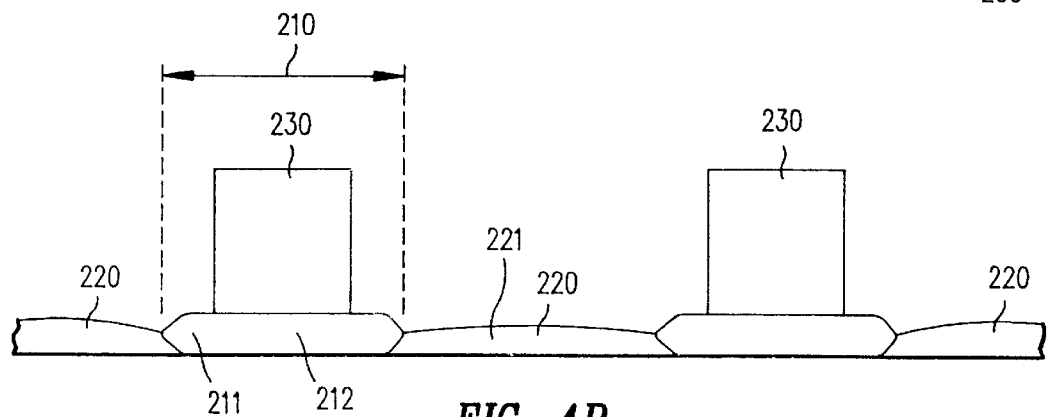
Figure 4C:
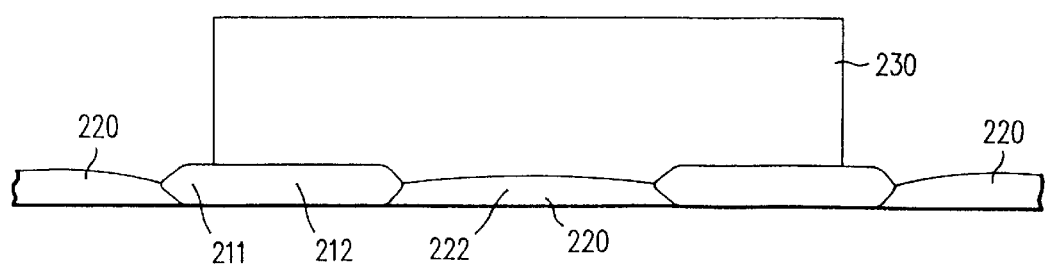

With reference to FIG. 4A, there is shown a top view of step 200 in the preferred method of making the MR sensor of the present invention prior to ion beam milling which shows MR material 220, end regions 210, and photoresist material 230 covering a predefined portion of MR material 220 and end regions 210. Central region 225 comprises exposed MR material 221 (the portion not covered by photoresist 230) and unexposed (covered) MR material 222 (the portion covered by photoresist 230). End regions 210 includes exposed (not covered by photoresist 230) conductor and longitudinal bias materials 211 and covered conductor and longitudinal bias materials 212. FIG. 4B is a cross-section of the materials shown in step 200 along the line B-B' which is the region directly behind the active region of the MR sensor. FIG. 4C is a cross-section of the materials shown in step 200 along the line A-A' which is a part of the active region of the MR sensor.

Figure 4D:
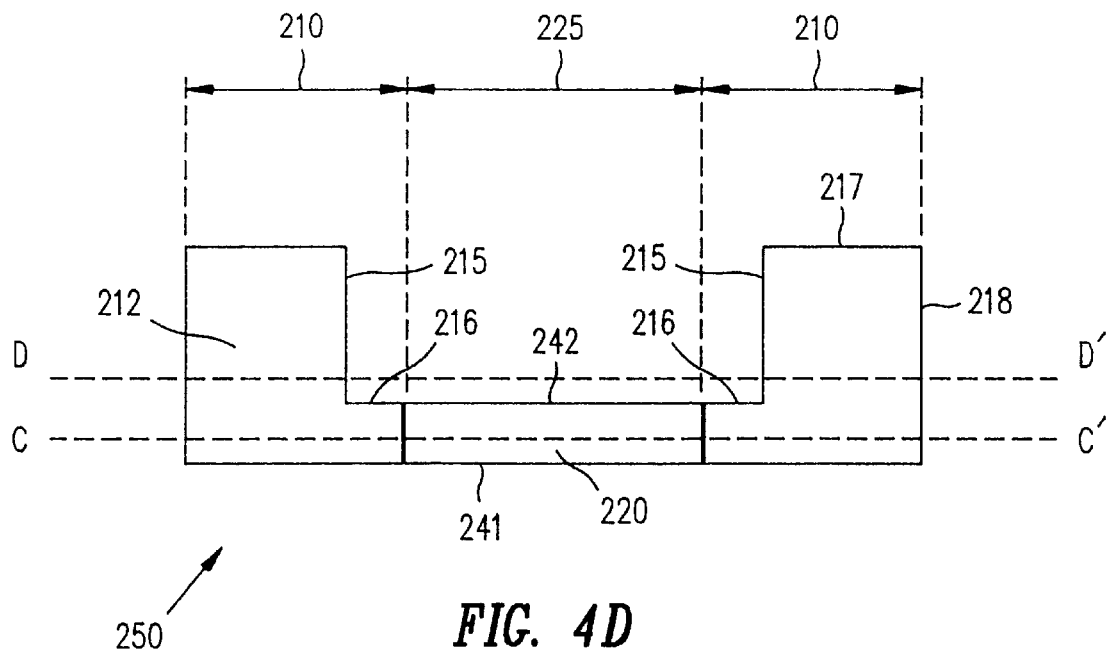
Figure 4E:
Figure 4F:
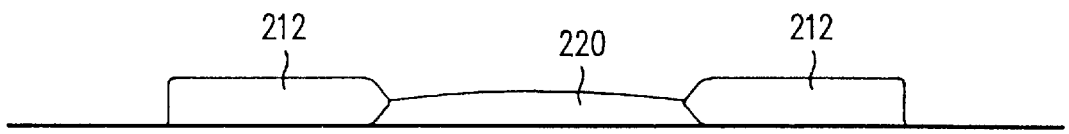

FIG. 4D shows a top view of step 250 in the preferred method of making the MR sensor of the present invention after ion beam milling and photoresist removal which shows MR material 220 having track width edge 241 and back side 242 in central region 225 and lead material 212 in end regions 210. Each end region 210 has planar sides 215, 216, 217, and 218 where the planar sides have no thinned edges (or shoulders). FIG. 4E shows a cross-section of the materials shown in step 250 along the line D-D' which is the region directly behind the active region of the MR sensor. As shown in FIG. 4E, sides 215 and 218 are planar sides having no thinned edges or shoulders. FIG. 4F shows a cross-section of the materials shown in step 250 along the line C-C' which is a part of the active region of the MR sensor.

Now with reference to FIGS. 4D, 4E and 4F, it can readily be seen that according to the present invention, during the ion beam milling step, the ion beam milling is continued until exposed portion 221 of MR material 220 (the portion not covered by photoresist 230) as well as exposed portion 211 of end regions 210 (the portion of the end regions not covered by photoresist 230) are completely removed. As can be seen, the structure shown in FIGS. 4D–4F has planar sides 215, 216, 217, and 218 around the circumference of each end region 210 as opposed to thinned edges along the circumference of end regions 210. The structure shown in FIGS. 4D–4F also does not have remnant MR material along planar sides 215 of each end region 210 near the MR sensor's back side 242. Furthermore, back side 242 of the MR sensor is parallel and self-aligned with inner planar side 216 of each end region 210, thus preventing current crowding and providing a well defined geometry from which the sensor's resistance can be accurately calculated.

Figure 5A:
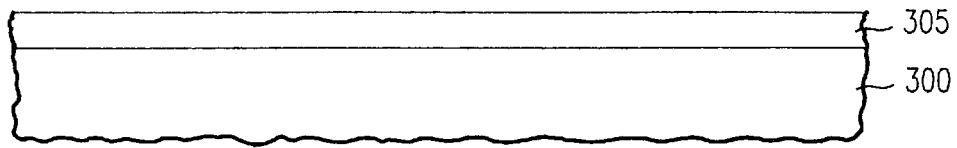
FIGS. 5A–5I show a specific embodiment of a process for fabricating the MR sensor of the present invention.
Figure 5B:
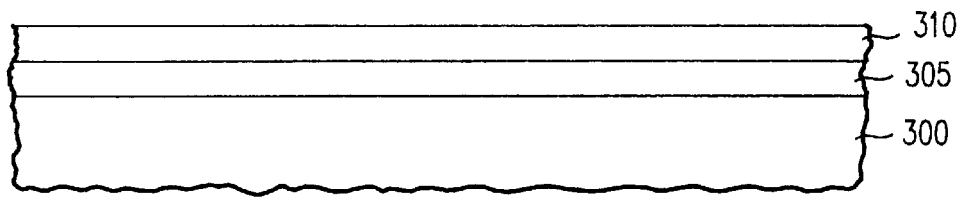
Figure 5C:
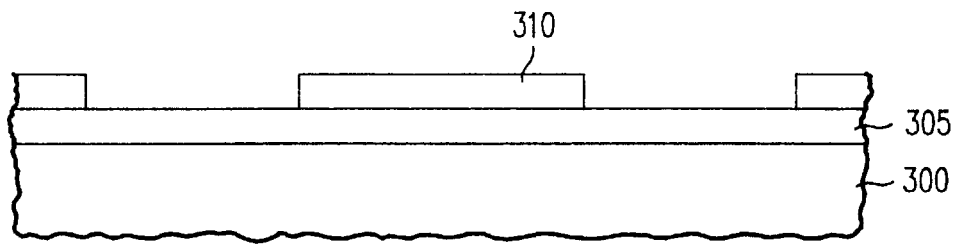
Figure 5D:
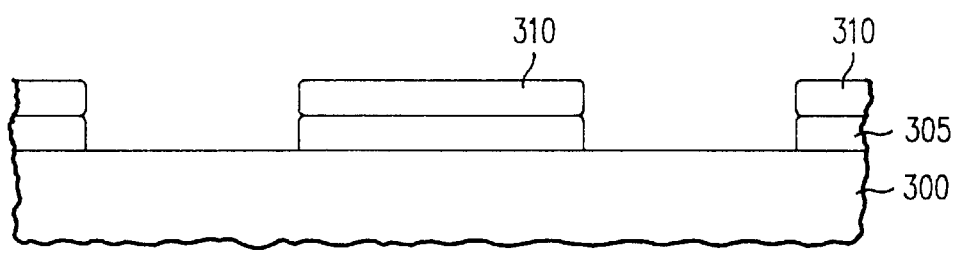
Figure 5E:
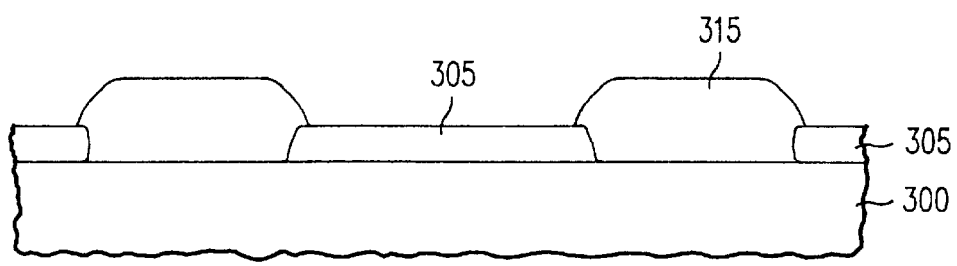
Figure 5F:
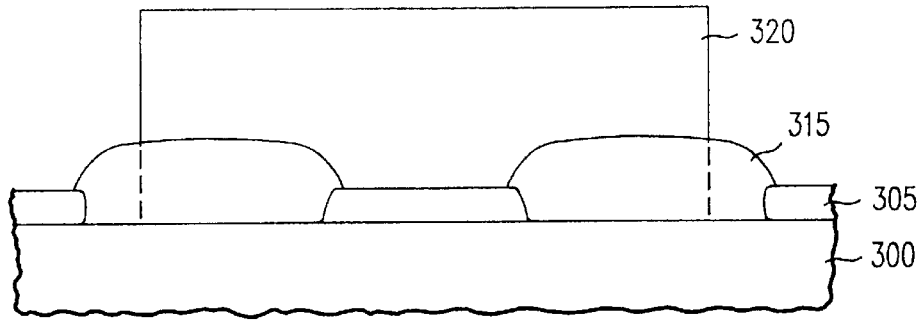
Figure 5G:
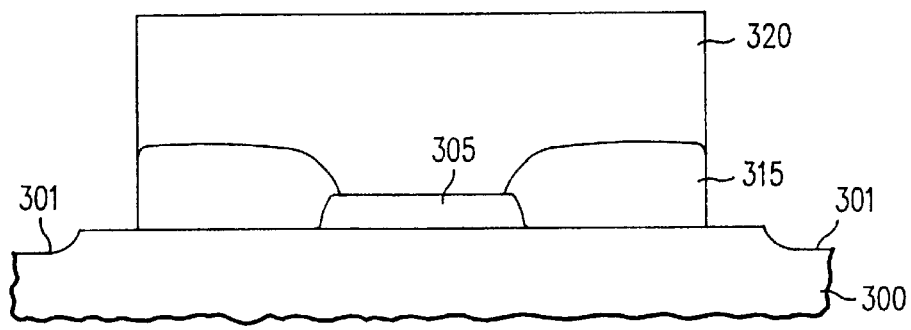

With reference to FIGS. 5A–5I, there is shown an example of the preferred method of manufacturing the thin film MR head of the present invention. The method comprises the steps of depositing upon a suitable substrate 300, a layer of MR material 305 such as NiFe (FIG. 5A) followed by depositing a film of suitable material 310 such as photoresist (FIG. 5B), and then patterning, exposing and developing the photoresist material to define the active regions of the MR sensor (FIG. 5C). Thereafter, the exposed portion of the NiFe is removed by etching (FIG. 5D). Next, the end region material 315 is deposited over substrate 300 followed by removing the resist over the remaining NiFe (FIG. 5E). The end regions comprise conductor material such as tantalum or gold and longitudinal bias materials such as NiFe/NiMn or CoPtCr, for example. Next, photoresist 320 is deposited over the end regions 315 and MR material 305 and patterned for defining the MR sensor having a center active region and two passive end regions (FIG. 5F). Thereafter, the sensor pattern is defined by ion beam milling the exposed portion of MR material 305 and the exposed portion of end regions 315. The ion beam milling is continued until the exposed portion of the MR material and the exposed portion of the end regions not covered by photoresist material 320 are completely etched away (FIG. 5G).

Figure 5H:
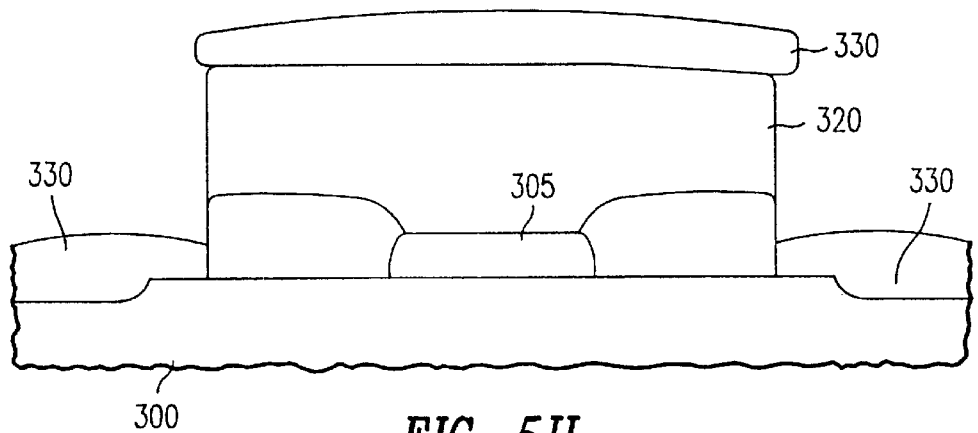
Figure 5I:
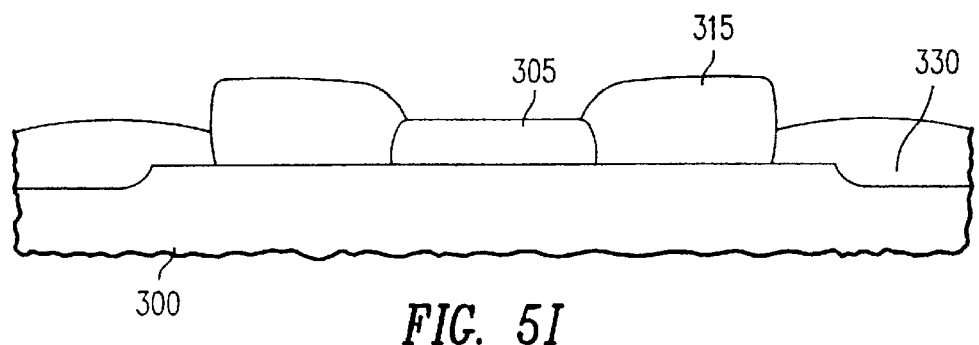

Since the extent of ion beam milling in the present invention is determined by the ion milling of the end regions, that means that substrate 300 will also be etched away to some extent in the areas where the excess (exposed) MR material was located. The etched portions 301 of substrate 300 is therefore refilled ("backfill") by either depositing or sputtering materials such as alumina 330 over resist 320 and exposed ion milled regions (FIG. 5H). Excess Alumina material deposited over photoresist 320 is then removed as a result of photoresist 320 lift off (FIG. 5I).

Figure 6A:
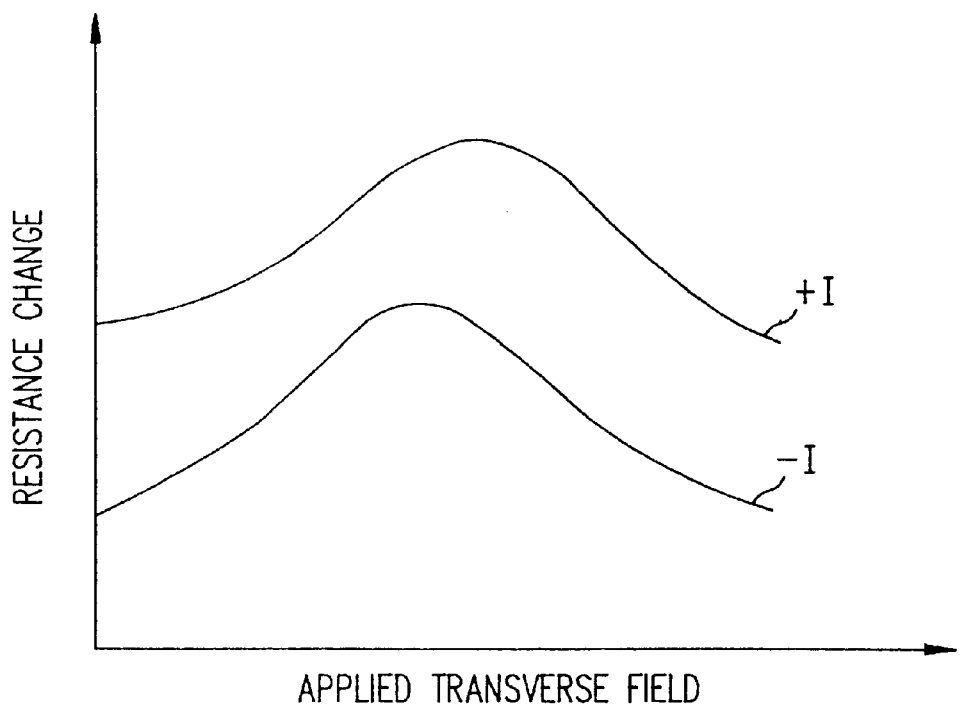
FIGS. 6A and 6B show the transfer curves of the sensor of FIG. 2 and the MR sensor of the present invention, respectively; and, FIGS. 7A and 7B show a perspective view of the prior art MR sensor and the present invention MR sensor, respectively, after ion beam milling and photoresist removal steps.
Figure 6B:
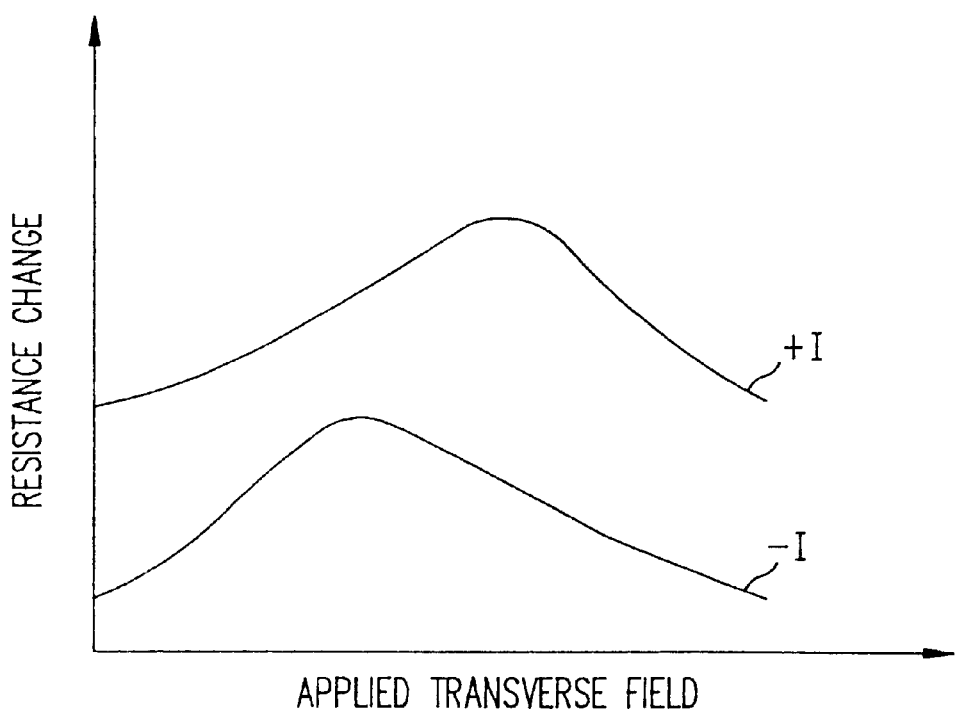

With reference to FIGS. 6A there is shown the measured transfer curve of resistance change versus applied transverse field for an MR sensor having thinned end regions as well as remnant MR material applying positive and negative currents. FIG. 6B depicts the measured transverse curve of resistance change versus applied transverse field for the MR sensor of the present invention having no thinned end regions and no remnant MR material applying positive and negative currents. It can readily be seen that the transfer curve (resistance change versus applied transverse filed) of the MR sensor of the present invention, as shown in FIG. 6B, is substantially noise-free as opposed to the prior art MR sensor of FIG. 6A which is substantially noisy.

Figure 3A:
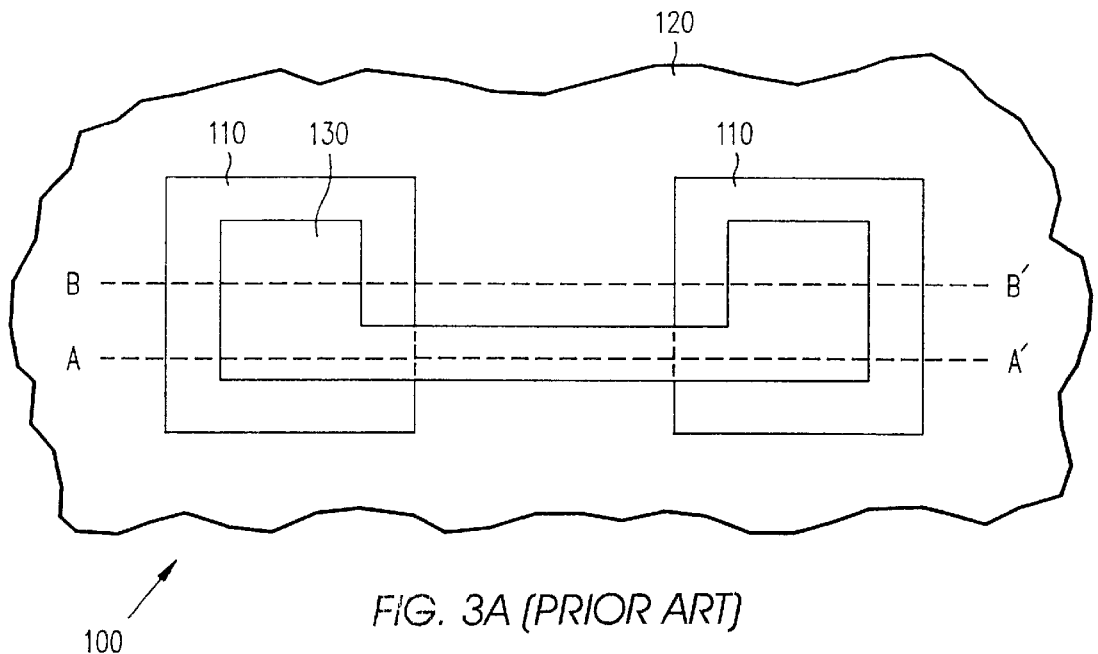
FIGS. 3A–3F show specific process steps for producing the MR sensor of shown in FIG. 2.
Figure 3B:
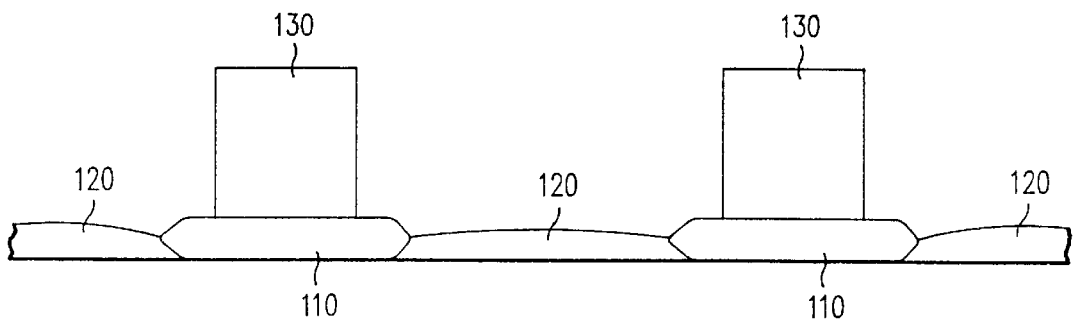
Figure 3C:
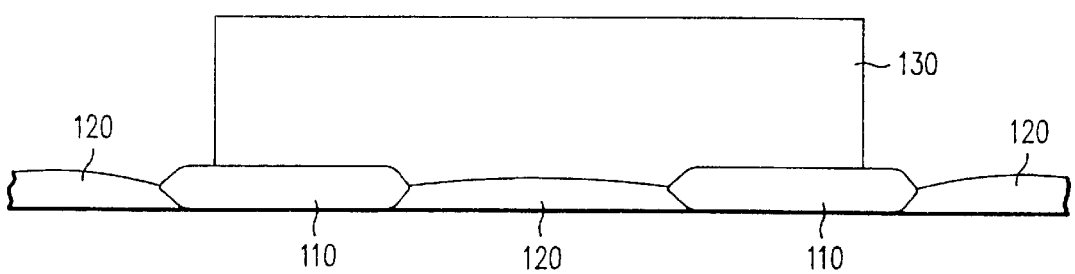
Figure 3D:
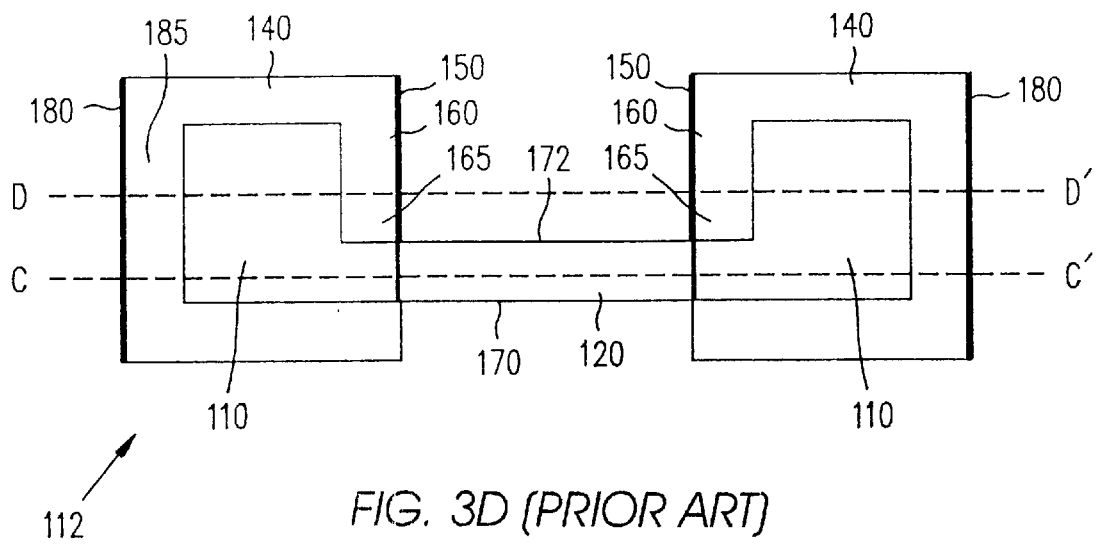
Figure 3E:
Figure 3F:
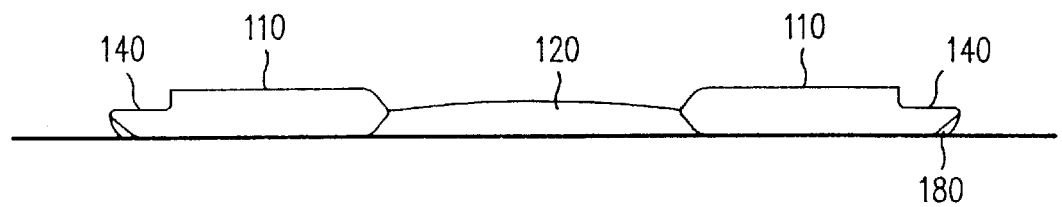
Figure 7A:
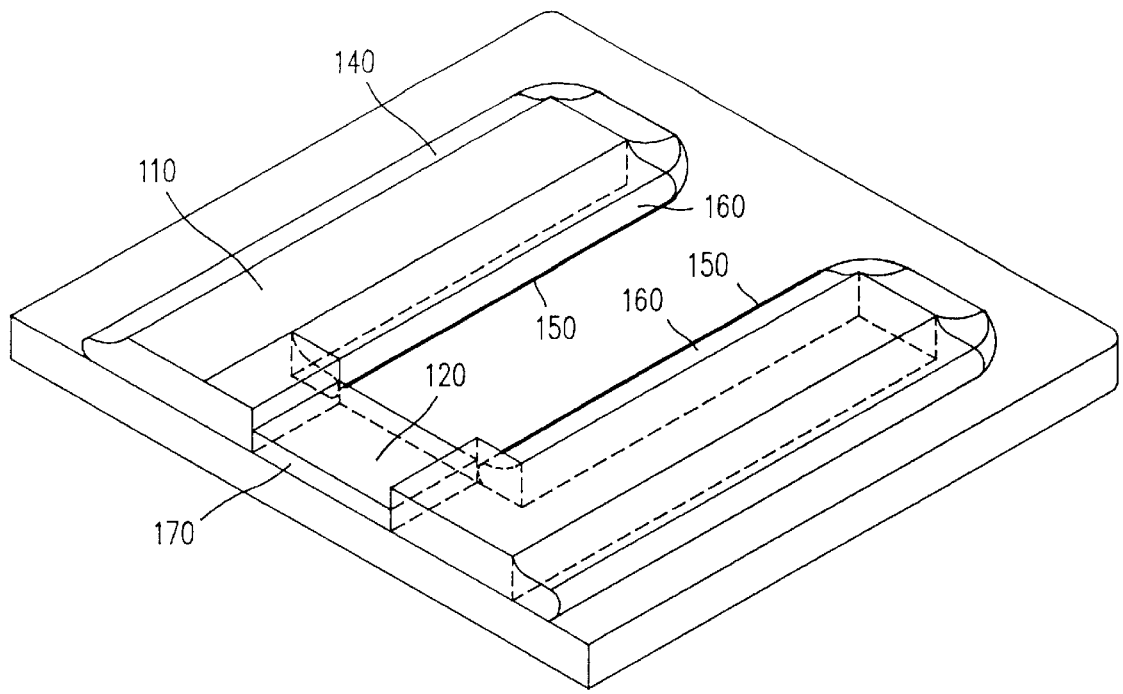
Figure 7B:
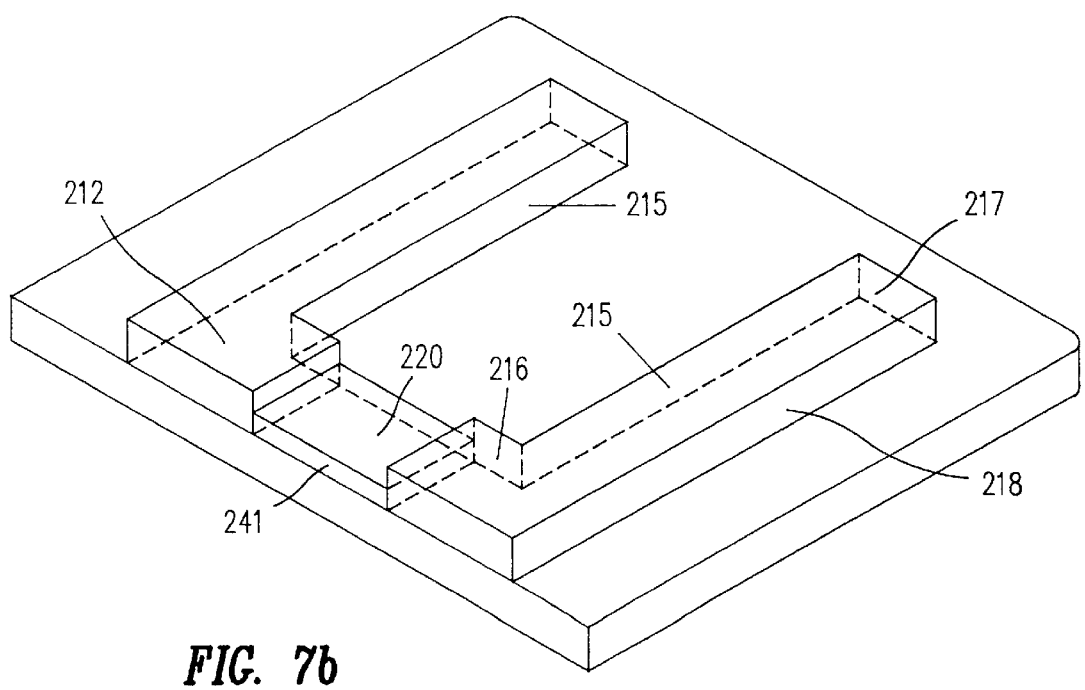

With reference to FIGS. 7A and 7B, there is shown a perspective view of the MR device of FIG. 3D of the prior art after ion milling and resist removal and a perspective view of the MR sensor of FIG. 4D of the present invention after ion milling and resist removal, respectively. In constructing the MR sensor shown in FIG. 7A, the extent of ion milling for removing the excess MR material is determined by the time it takes to remove the exposed MR material itself. This means that thinned edges (or shoulders) along the circumference of the end regions are created as well as a small remnant MR material 150 which are left behind along thinned inner edges 160 behind the MR sensor's trackwidth edge 170 and near the back edge of the MR sensor.

Figure 1:
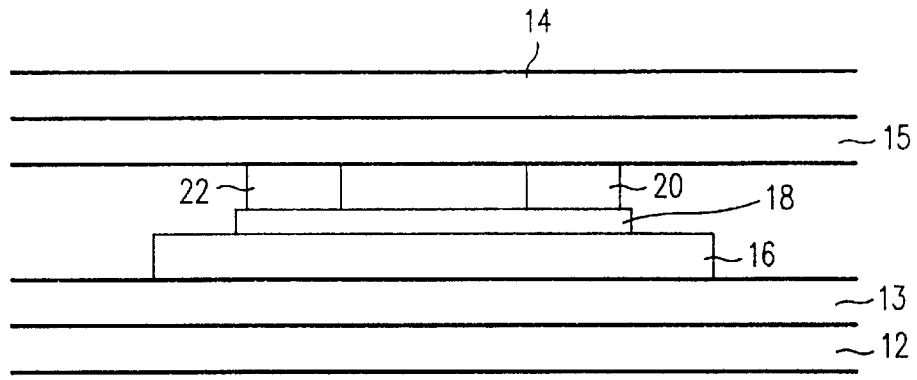
FIG. 1 shows a basic magnetoresistive head.
Figure 2A:
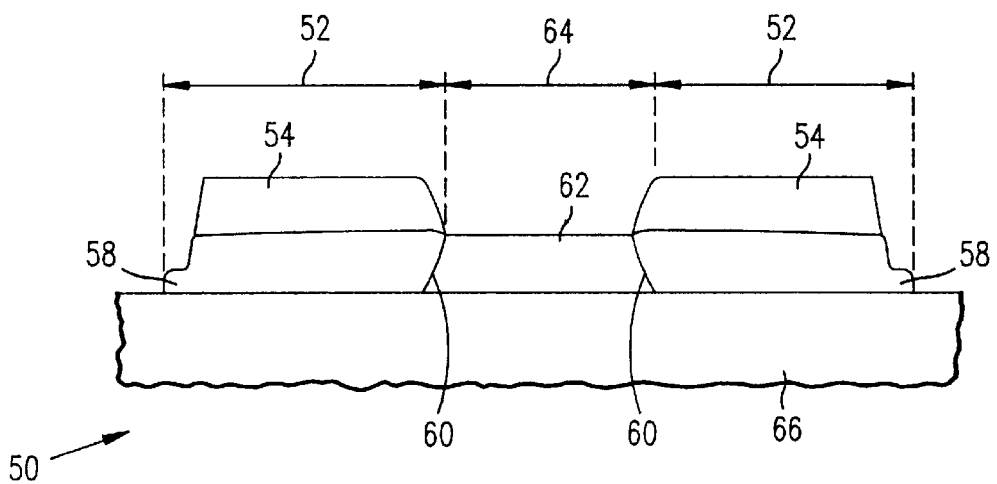
FIG. 2A shows a cross section of a conventional MR sensor.
Figure 2B:
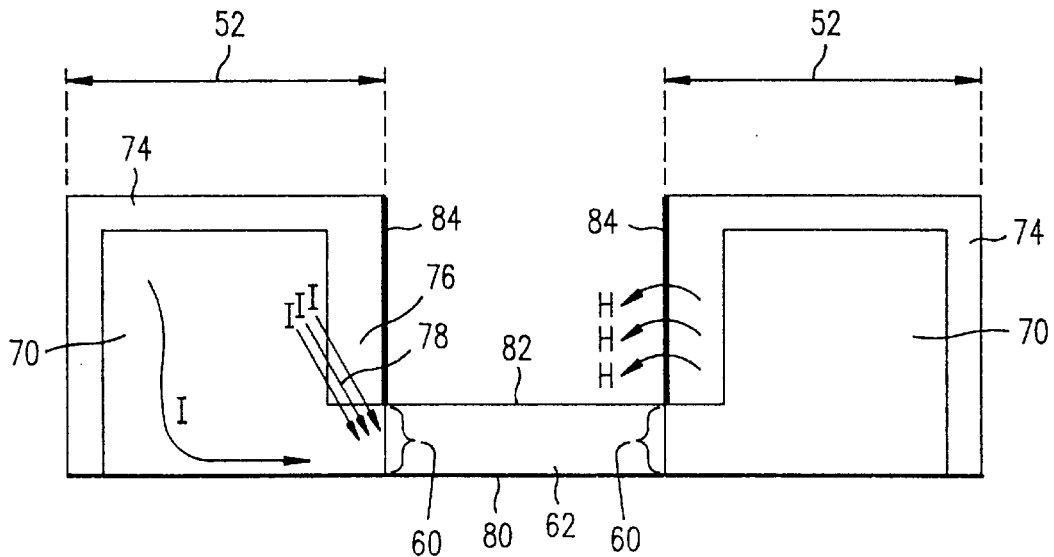
FIG. 2B shows a top view of the sensor of FIG. 2A.

Referring to FIGS. 2B and 7A, it is well known in the art that the thinned edges (1) causes current crowding which affects the amplitude of the read signal because most of the current I flows toward the back edge of the MR sensor as opposed to the track width (air bearing) edge of the MR sensor; (2) the longitudinal bias material in the thinned edges creates fringing field H at the back edge of the MR sensor which affects the linearity and the bias point of the MR sensor; and (3) the remnant MR material causes the MR sensor to be noisy and it degrades and alters its magnetic domain activities.

In contrast, in constructing the MR sensor of the present invention, shown in FIG. 7B, since the extent (i.e., duration) of ion milling is determined by the time it take to remove the exposed material in the end regions, which are thicker than the thickness of the MR material in the central region, there are neither thinned edges along the circumference of the end regions nor any remnant MR material along planar inner edges 215. Therefore, the MR sensor of the present invention is substantially free of current crowding and fringing fields due to the thinned edges and degraded magnetic domain activity due to the remnant MR material.

While the present invention has been particularly shown and fully described with reference to the preferred embodiment of the present invention, nevertheless, it will be understood by those skilled in the art that various modifications may be made without departing from the spirit and the scope of the invention. For example, although, the preferred embodiment of the present invention was described in terms of an anisotropic MR sensor, the invention is equally applicable to a spin valve MR sensor. Accordingly, it is to be understood that the invention is not to be limited by the specific illustrated embodiments, but only by the scope of the appended claims.

We claim:

1. A method for making a magnetoresistive (MR) sensor having end regions separated by a central region, comprising the steps of:

provinding a substrate;

depositing magnetoresistive material over the substrate in the area of said central region;

depositing lead material over the substrate in the area of said end regions;

forming a stencil over the magnetoresistive material in the area of said central region and over the lead material in the area of said end regions for defining the shape of said central and said end regions;

etching away the portion of magnetoresistive material and the portion of lead material not covered by said stencil, the duration of etching being sufficient to etch away the portion of said lead material not covered by said stencil and longer than necessary to etch away all of the magnetoresistive material not covered by said stencil, whereby a portion of the substrate beneath the magnetoresistive material not covered by said stencil is also etched away;

backfilling the etched-away portion of the substrate with nonmagnetic material; and removing said stencil.

2. The method for making an MR sensor according to claim 1 wherein said lead material comprises longitudinal bias and conducting materials.

3. The method for making an MR sensor according to claim 2 wherein said conductor material includes tantalum.

4. The method for making an MR sensor according to claim 2 wherein said conductor material includes gold.

5. The method for making an MR sensor according to claim 2 wherein said longitudinal bias material includes hard magnetic bias material.

6. The method for making an MR sensor according to claim 5 wherein said hard magnetic bias material includes cobalt platinum chromium (CoPtCr).

7. The method for making an MR sensor according to claim 2 wherein said longitudinal bias material includes antiferromagnetic material and soft magnetic bias material.

8. The method for making an MR sensor according to claim 7 wherein said antiferromagnetic material includes nickel manganese (NiMn) and said soft magnetic bias material includes nickel iron (NiFe).

9. The method for making an MR sensor according to claim 7 wherein said antiferromagnetic material includes manganese iron (MnFe) and said soft magnetic bias material includes nickel iron (NiFe).

10. A method for making a spin valve magnetoresistive (MR) sensor having end regions separated by a central region, comprising the steps of:

providing a substrate;

depositing spin valve material over the substrate in the area of said central region;

depositing lead material over the substrate in the area of said end regions;

forming a stencil over the magnetoresistive material in the area of said central region and over the lead material in the area of said end regions for defining the shape of said central and said end regions;

etching away the portion of spin valve material and the portion of lead material not covered by said stencil, the duration of etching being sufficient to etch away the portion of said lead material not covered by said stencil and longer than necessary to etch away all of the spin valve not covered by said stencil, whereby a portion of the substrate beneath the spin valve material not covered by said stencil is also etched away;

backfilling the etched-away portion of the substrate with nonmagnetic material; and removing said stencil.

11. The method of for making a spin valve MR sensor according to claim 10 wherein said lead material comprises longitudinal bias and conducting materials.

12. The method for making a spin valve MR sensor according to claim 11 wherein said longitudinal bias material includes hard magnetic bias material.

13. The method for making a spin valve MR sensor according to claim 12 wherein said hard magnetic bias material includes cobalt platinum chromium (CoPtCr).

14. The method for making a spin valve MR sensor according to claim 11 wherein said longitudinal bias material includes antiferromagnetic material and soft magnetic bias material.

15. The method for making a spin valve MR sensor according to claim 14 wherein said antiferromagnetic material includes nickel manganese (NiMn) and said soft magnetic bias material includes nickel iron (NiFe).

16. The method for making a spin valve MR sensor according to claim 14 wherein said antiferromagnetic material includes manganese iron (MnFe) and said soft magnetic bias material includes nickel iron (NiFe).

* * * * *